(12) United States Patent
Nishimura

(10) Patent No.: US 10,199,347 B2
(45) Date of Patent: Feb. 5, 2019

(54) SEMICONDUCTOR DEVICE

(71) Applicant: Fuji Electric Co., Ltd., Kanagawa (JP)

(72) Inventor: Tomohiro Nishimura, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/376,543

(22) Filed: Dec. 12, 2016

(65) Prior Publication Data

US 2017/0213806 A1 Jul. 27, 2017

(30) Foreign Application Priority Data

Jan. 22, 2016 (JP) ................................. 2016-010826

(51) Int. Cl.
*H01L 23/00* (2006.01)
*H01L 23/373* (2006.01)
(Continued)

(52) U.S. Cl.
CPC .......... *H01L 24/46* (2013.01); *H01L 23/3735* (2013.01); *H01L 23/49811* (2013.01); *H01L 24/40* (2013.01); *H01L 24/41* (2013.01); *H01L 24/45* (2013.01); *H01L 24/85* (2013.01); *H01L 25/072* (2013.01); *H01L 25/18* (2013.01); *H01L 29/1608* (2013.01); *H01L 29/2003* (2013.01); *H01L 29/7805* (2013.01); *H01L 29/872* (2013.01); *H01L 24/37* (2013.01); *H01L 24/48* (2013.01); *H01L 24/49* (2013.01); *H01L 24/84* (2013.01); *H01L 2224/05553* (2013.01); *H01L 2224/0603* (2013.01); *H01L 2224/29101* (2013.01); *H01L 2224/32225* (2013.01);
(Continued)

(58) Field of Classification Search
None
See application file for complete search history.

(56) References Cited

U.S. PATENT DOCUMENTS 7,271,470 B1 * 9/2007 Otremba ............... H01L 23/492
257/666
8,120,153 B1 * 2/2012 Shen ...................... H01L 21/565
257/677
(Continued)

FOREIGN PATENT DOCUMENTS

JP 2015-035627 A 2/2015

OTHER PUBLICATIONS

Skowronski et al, "Degradation of hexagonal silicon-carbide-based bipolar devices", Journal of Applied Physics, 2006, vol. 99, pp. 011101-1-011101-24.

*Primary Examiner* — Ermias T Woldegeorgis
(74) *Attorney, Agent, or Firm* — Chen Yoshimura LLP

(57) ABSTRACT

A semiconductor device includes a semiconductor chip having a source electrode on the front surface thereof, a diode that has an anode electrode on the front surface thereof, and a first conductive member through which output signals from the source electrode pass. The semiconductor device further includes a first wiring member that electrically connects the source electrode and the first conductive member, and a second wiring member that electrically connects the anode electrode and the first conductive member and that has a wider surface area than the first wiring member. The semiconductor device includes a second conductive member where the semiconductor chip and the diode are arranged.

8 Claims, 4 Drawing Sheets

(51) Int. Cl.
*H01L 25/18* (2006.01)
*H01L 29/16* (2006.01)
*H01L 29/20* (2006.01)
*H01L 29/78* (2006.01)
*H01L 29/872* (2006.01)
*H01L 25/07* (2006.01)
*H01L 23/498* (2006.01)

(52) U.S. Cl.
CPC ............ *H01L 2224/3716* (2013.01); *H01L 2224/37124* (2013.01); *H01L 2224/37139* (2013.01); *H01L 2224/37144* (2013.01); *H01L 2224/37147* (2013.01); *H01L 2224/40095* (2013.01); *H01L 2224/40225* (2013.01); *H01L 2224/41113* (2013.01); *H01L 2224/4516* (2013.01); *H01L 2224/45124* (2013.01); *H01L 2224/45139* (2013.01); *H01L 2224/45144* (2013.01); *H01L 2224/45147* (2013.01); *H01L 2224/48227* (2013.01); *H01L 2224/49051* (2013.01); *H01L 2224/49113* (2013.01); *H01L 2224/73263* (2013.01); *H01L 2224/83801* (2013.01); *H01L 2224/84205* (2013.01); *H01L 2224/84801* (2013.01); *H01L 2224/85205* (2013.01); *H01L 2924/00014* (2013.01); *H01L 2924/1033* (2013.01); *H01L 2924/10272* (2013.01); *H01L 2924/12032* (2013.01); *H01L 2924/13091* (2013.01); *H01L 2924/30101* (2013.01)

(56) References Cited

U.S. PATENT DOCUMENTS

| | | |
|---|---|---|
| 9,147,666 B2 | 9/2015 | Yoshihara et al. |
| 2008/0180871 A1* | 7/2008 | Hebert .................. H01L 24/49 361/106 |
| 2009/0206812 A1* | 8/2009 | Sasaya ................ H02M 3/1588 323/282 |
| 2011/0272797 A1* | 11/2011 | Onishi .................. H01L 23/24 257/698 |

* cited by examiner

SEMICONDUCTOR DEVICE

BACKGROUND OF THE INVENTION

Technical Field

The present invention relates to a semiconductor device.

Background Art

The semiconductor device includes a plurality of power semiconductor elements and is used as a power converter or a switching device. The semiconductor device has semiconductor chips including IGBTs (insulated gate bipolar transistors), MOSFETs (metal oxide semiconductor field effect transistors), or the like connected together to be able to function as a switching device.

Silicon carbide (SiC) has seen particularly frequent usage recently as a constituting material for MOSEFETs. In a MOSFET made of silicon carbide, a parasitic diode is embedded in the top of the device structure. When this type of MOSFET is operated and current continually flows to the parasitic diode, stacking faults (SFs) grow from basal plane dislocations (BPDs) in the SiC wafer, the SiC epitaxial layer, or both. This is known to increase the ON resistance of the MOSFET and degrade reliability of the MOSFET (see Non-patent Document 1, for example).

As a countermeasure, ordinarily, a freewheeling diode such as a Schottky barrier diode (SBDs) made of silicon carbide can be connected in parallel to the silicon carbide MOSFET to reduce the flow of current to the parasitic diode of the MOSFET. This inhibits the growth of stacking faults in the MOSFET.

The growth of stacking faults also occurs in IGBT device structures.

RELATED ART DOCUMENT

Non-Patent Document

Non-Patent Document 1: M. Skowronski and S. Ha, "Degradation of hexagonal silicon-carbide-based bipolar devices," Journal of Applied Physics, 2006, Vol. 99, 011101

SUMMARY OF THE INVENTION

However, even if a freewheeling diode is connected in parallel to the MOSFET made of silicon carbide, the reverse conducting current to the MOSFET is split by the parasitic diode of the MOSFET and the freewheeling diode. In other words, there is still a risk of current flowing to the parasitic diode, which will raise ON resistance and degrade the reliability of the MOSFET. "Reverse conducting current" is the current flowing from the source electrode towards the drain electrode.

The present invention was made in view of the above and aims at providing a semiconductor device in which the flow of current to the parasitic diode is reduced. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a first conductive plate having an elongated shape extending in a first direction; a second conductive plate disposed side-by-side with the first conductive plate in a second direction perpendicular to the first direction; a semiconductor chip disposed on the second conductive plate and having a source electrode on a front surface of the semiconductor chip; a diode disposed on the second conductive plate side-by-side with the semiconductor chip in the first direction and having an anode electrode on a front surface of the diode; a first wiring member having an elongated shape in a plan view extending in the second direction and electrically connecting the source electrode of the semiconductor chip to the first conductive plate; and a second wiring member having an elongated shape in the plan view extending in the second direction and electrically connecting the anode electrode of the diode to the first conductive plate, wherein an electrical resistance of the second wiring member is smaller than an electrical resistance of the first wiring member.

In another aspect, the present disclosure provides a first conductive plate; a second conductive plate; a semiconductor chip disposed on the second conductive plate and having a source electrode on a front surface of the semiconductor chip; a diode disposed on the second conductive plate and having an anode electrode on a front surface of the diode; a first wiring member electrically connecting the source electrode to the first conductive plate, the first conductive plate receiving output signals from the source electrode; and a second wiring member electrically connecting the anode electrode to the first conductive plate, wherein a surface area of the second wiring member is greater than a surface area of the first wiring member.

In another aspect, the present invention provides a semiconductor device, including: a first conductive plate; a second conductive plate; a semiconductor chip disposed on the second conductive plate and having a source electrode on a front surface of the semiconductor chip; a diode disposed on the second conductive plate and having an anode electrode on a front surface of the diode; a first wiring member electrically connecting the source electrode to the first conductive plate, the first conductive plate receiving output signals from the source electrode; and a second wiring member electrically connecting the anode electrode to the first conductive plate, wherein an electrical resistance of the second wiring member is smaller than an electrical resistance of the first wiring member.

The disclosed technology can suppress an increase in ON resistance of a semiconductor chip and prevent degradation in reliability. It is to be understood that both the foregoing general description and the following detailed description are exemplary and explanatory, and are intended to provide further explanation of the invention as claimed.

BRIEF DESCRIPTION OF THE DRAWINGS

FIG. 2A is a side view when seen from the arrow Y in FIG. 1, and FIG. 2B is a side view when seen from the arrow X in FIG. 1

DETAILED DESCRIPTION OF EMBODIMENTS

Embodiments will be described below using the drawings, but the embodiments described below do not limit the present invention according to the claims. All combinations of features described in the embodiments are not necessarily required in the present invention's means of solving the problems.

Embodiment 1

A semiconductor device according to Embodiment 1 will be described using FIG. 1 and FIGS. 2A and 2B.

Figure 1:
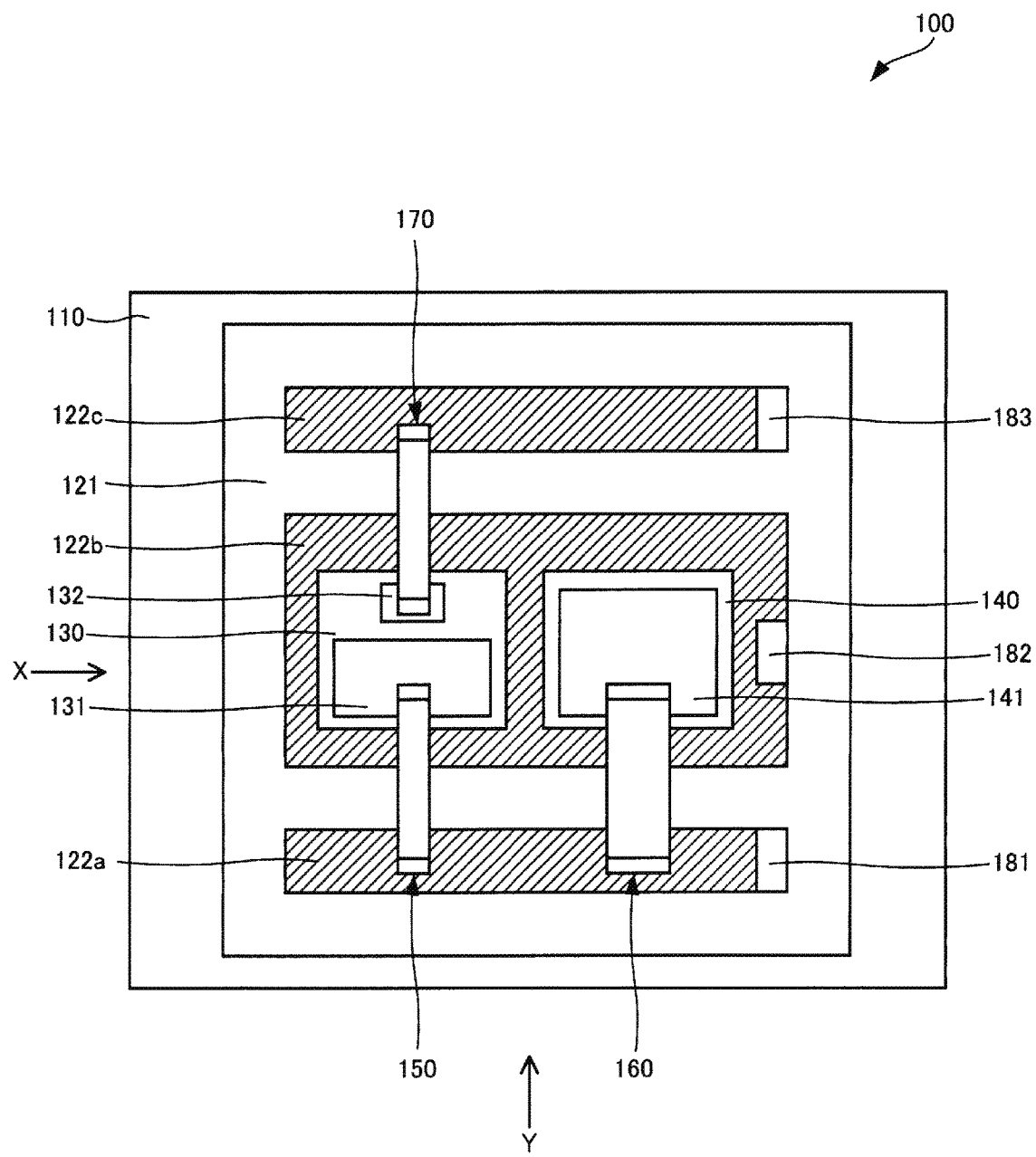
FIG. 1 is a top view of a semiconductor device of Embodiment 1.

FIG. 1 is a top view of a semiconductor device according to Embodiment 1.

Figure 2A:
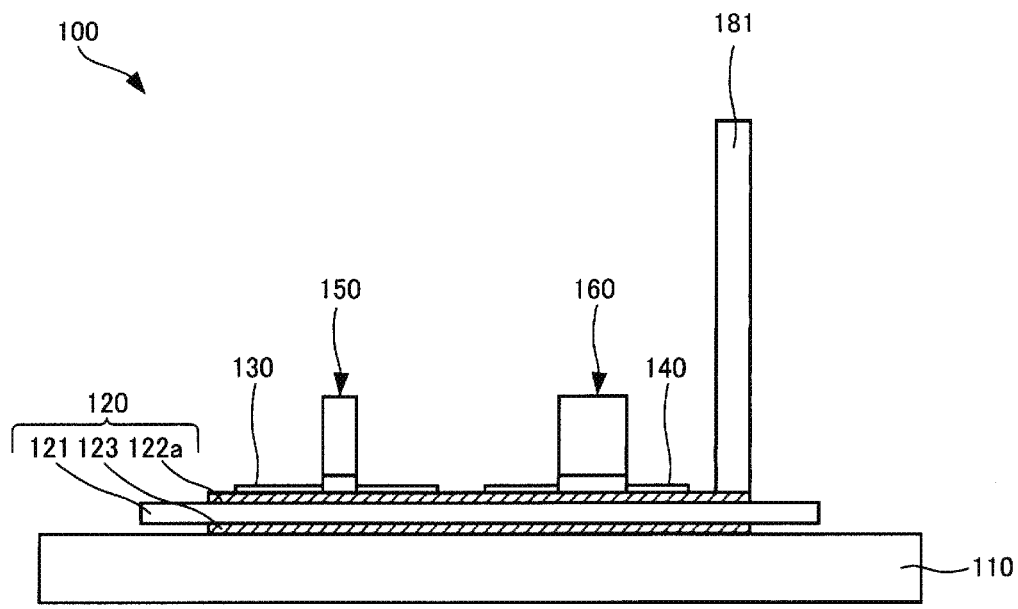
FIGS. 2A and 2B are side views of the semiconductor device of Embodiment 1.
Figure 2B:
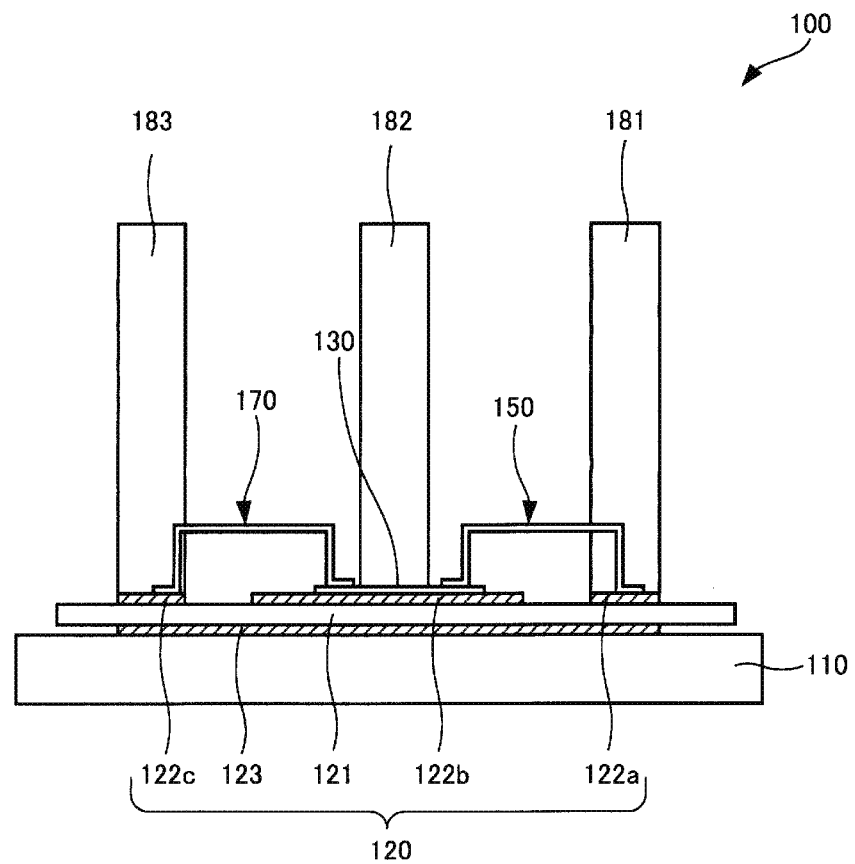

FIGS. 2A and 2B are side views of the semiconductor device of Embodiment 1.

However, FIG. 2A is a side view when seen from the arrow Y in FIG. 1, and FIG. 2B is a side view when seen from the arrow X in FIG. 1.

A semiconductor device 100 includes a heat dissipating base 110, a multilayer substrate 120 on the heat dissipating base 110, and a semiconductor chip 130 and diode 140 on the multilayer substrate 120. In addition, the semiconductor device 100 includes a first wiring member 150, second wiring member 160, and third wiring member 170 that respectively electrically connect the multilayer substrate 120 to the semiconductor chip 130 and diode 140, and first, second, and third external terminals 181, 182, and 183 that electrically connect to the multilayer substrate 120.

The heat dissipating base 110 is made of a material with high thermal conductivity, such as copper (Cu), aluminum (Al), or aluminum silicon carbide (Al—SiC), for example.

The multilayer substrate 120 includes an insulating plate 121 such as a ceramic plate, patterned first, second, and third conductive members (conductive plates) 122a, 122b, and 122c formed on the front surface of the insulating plate 121, and a fourth conductive member 123 formed on the back surface of the insulating plate 121.

The semiconductor chip 130 includes a MOSFET device structure, with a source electrode 131 and gate electrode 132 on the front surface and a drain electrode on the back surface. The MOSFET is made of a wide bandgap semiconductor such as silicon carbide or gallium nitride, for example. This type of semiconductor chip 130 has high insulation and can operate at high frequencies and high temperatures. Furthermore, the drain electrode of the semiconductor chip 130 is disposed on and electrically connected to the top of the second conductive member 122b of the multilayer substrate 120 via an adhesive material such as solder. The semiconductor chip 130 has a parasitic diode in the internal structure thereof that connects in parallel to the MOSFET.

The diode 140 is a Schottky barrier diode and has an anode electrode 141 on the front surface thereof and a cathode electrode on the back surface, for example. The diode 140 is also made of a wide bandgap semiconductor, such as silicon carbide or gallium nitride. This type of diode 140 also has high insulation and can operate at high frequencies and high temperatures. Furthermore, the cathode electrode of the diode 140 is disposed on and electrically connected to the top of the second conductive member 122b of the multilayer substrate 120 via an adhesive material such as solder.

The first wiring member 150 is electrically connected to the source electrode 131 of the semiconductor chip 130 and the first conductive member 122a of the multilayer substrate 120. The first wiring member 150 is made of at least of gold (Au), silver (Ag), copper, aluminum, and iron (Fe). Furthermore, the first wiring member 150 is bonded to the source electrode 131 and first conductive member 122a via solder, a paste containing metal particles, or the like, or bonded via ultrasonic bonding. As shown in FIG. 1 and FIGS. 2A and 2B, the first wiring member 150 is formed in a reverse "U" shape by a plate-like member, but the first wiring member is not limited to this and can be formed by a column-shaped member such as a wire.

The second wiring member 160 is electrically connected to the anode electrode 141 of the diode 140 and the first conductive member 122a of the multilayer substrate 120. The second wiring member 160 is made of at least one of gold, silver, copper, aluminum, and iron. Furthermore, the second wiring member 160 is bonded to the anode electrode 141 and first conductive member 122a via solder, a paste containing metal particles, or the like, or bonded via ultrasonic bonding. As shown in FIG. 1 and FIGS. 2A and 2B, the second wiring member 160 is formed in a reverse "U" shape by a plate-like member, but the second wiring member is not limited to this and can be formed by a column-shaped member such as a wire. Furthermore, the second wiring member 160 has a wider surface area than the first wiring member 150. In other words, taking into account the skin effect, the surface area of the second wiring member 160 through which current flows is wider than the surface area of the first wiring member 150. In Embodiment 1, the second wiring member 160 is the same thickness as the first wiring member 150, and thus the width of the second wiring member 160 is greater than the first wiring member 150.

The third wiring member 170 is electrically connected to the gate electrode 132 of the semiconductor chip 130 and the third conductive member 122c of the multilayer substrate 120. The third wiring member 170 is made of at least one of gold, silver, copper, aluminum, and iron. Furthermore, the third wiring member 170 is bonded to the gate electrode 132 and third conductive member 122c via solder, a paste containing metal particles, or the like, or bonded via ultrasonic bonding. As shown in FIG. 1 and FIGS. 2A and 2B, the third wiring member 170 is formed in a reverse "U" shape by a plate-like member, but the third wiring member is not limited to this and can be formed by a column-shaped member such as a wire.

The first external terminal 181 has one end electrically connected to the negative pole of an external load, and another end electrically connected to the end of the first conductive member 122a of the multilayer substrate 120. The first external terminal 181 outputs output signals received from the source electrode 131 of the semiconductor chip 130 via the first wiring member 150 and first conductive member 122a.

The second external terminal 182 has one end electrically connected to the positive pole of the external load, and another end electrically connected to the end of the second conductive member 122b of the multilayer substrate 120. The second external terminal 182 transmits input signals received from outside to the drain electrode of the semiconductor chip 130 and the cathode electrode of the diode 140 via the second conductive member 122b.

The third external terminal 183 has one end electrically connected to an electrode that receives control signals, and another end electrically connected to the end of the third conductive member 122c of the multilayer substrate 120.

The third external terminal 183 transmits control signals received from outside to the gate electrode 132 of the semiconductor chip 130 via the third conductive member 122c and the third wiring member 170.

The semiconductor device 100 having this configuration has the first, second, and third external terminals 181, 182, and 183 each sealed with an insulating material such as a resin (not shown) so that one end of each protrudes.

Figure 3:
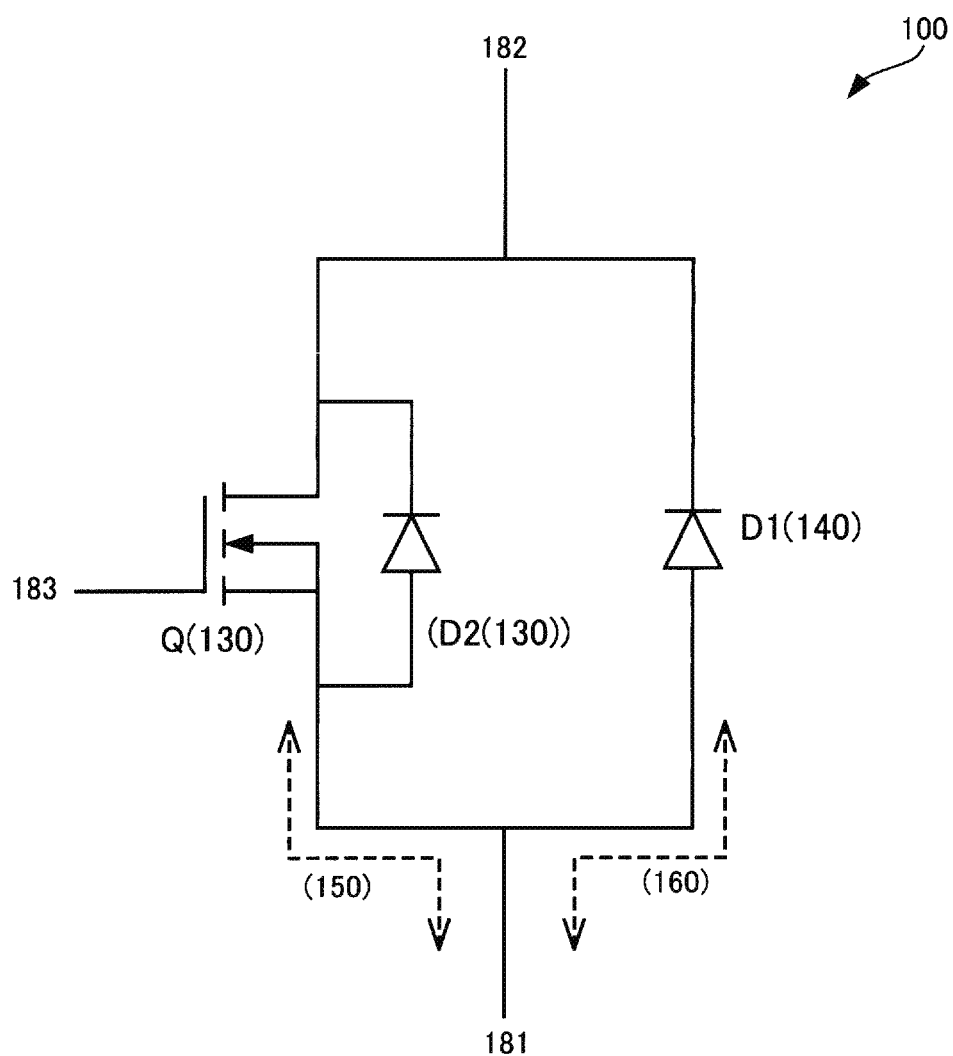
FIG. 3 is a view of a circuit diagram formed by the semiconductor device of Embodiment 1.

Next, FIG. 3 (and FIG. 1) will be used to describe a circuit configuration constituted by this semiconductor device 100 and the flow of signals.

FIG. 3 is a view of a circuit diagram formed by the semiconductor device of Embodiment 1.

In the semiconductor device 100, the MOSFET (Q) of the semiconductor chip 130 and the diode 140 (D1) are connected in parallel. A diode D2 is formed in the MOSFET (Q) of the semiconductor chip 130 as a parasitic diode. The diode D2 is connected in parallel to the MOSFET (Q) of the semiconductor chip 130.

In the semiconductor device 100, the negative pole of the external load is connected to the first external terminal 181, and the positive pole of the external load is connected to the second external terminal 182, and the third external terminal 183 receives control signals from outside.

Accordingly, the input signals received from the second external terminal 182 are input to the drain electrode of the MOSFET (Q) of the semiconductor chip 130 via the second conductive member 122b. The MOSFET (Q) of the semiconductor chip 130 receives control signals at the gate electrode 132 thereof from the third external terminal 183 via the third conductive member 122c and the third wiring member 170. The semiconductor chip 130 (Q) transmits output signals from the source electrode 131 thereof in accordance with the control signals. The output signals are output from the first external terminal 181 via the first wiring member 150 and the first conductive member 122a. In other words, the signals enter from the second external terminal 182 side and progress to the first external terminal side 181.

In this type of semiconductor device 100, when reverse conducting current flows from the first external terminal 181 to the second external terminal 182, the reverse conducting current passes through the first conductive member 122a and is split between the first wiring member 150 and the second wiring member 160.

Taking into account the skin effect, the surface area of the second wiring member 160 where current flows is wider than the surface area of the first wiring member 150, and the second wiring member 160 has a wider surface area than the first wiring member. In the semiconductor device 100, high frequency operation is possible due to the MOSFET (Q) of the semiconductor chip 130 made of the wide bandgap semiconductor and the diode 140 (D1). In this manner, in the second wiring member 160, the skin effect occurs due to the large surface area and the passing of high-frequency signals, and thus the electrical resistance of the second wiring member 160 is apparently lower than the electrical resistance of the first wiring member 150. A larger amount of the reverse conducting current from the first external terminal 181 flows to the second wiring member 160 than the first wiring member 150. Accordingly, the reverse conducting current flowing to the first wiring member 150 is reduced, and the reverse conducting current flowing to the diode D2 of the semiconductor chip 130 is also reduced, which inhibits the growth of stacking faults from the basal plane dislocations in the SiC wafer, SiC epitaxial layer, or both. This results in mitigating both an increase in the ON resistance of the MOSFET (Q) and the degradation in reliability of the semiconductor chip 130.

The second wiring member 160, as described above, is made of at least one of gold, silver, copper, aluminum, and iron. The use of these materials makes it easier for the skin effect to occur with respect to the second wiring member 160.

The semiconductor device 100 described above includes the semiconductor chip 130 that has the source electrode 131 on the front surface thereof, the diode 140 that has the anode electrode 141 on the front surface thereof, and the first conductive member 122a through which output signals from the source electrode 131 pass. The semiconductor device 100 further includes the first wiring member 150 that electrically connects the source electrode 131 and the first conductive member 122a, and the second wiring member 160 that electrically connects the anode electrode 141 and the first conductive member 122a and that has a wider surface area than the first wiring member 150. This causes more reverse conducting current to flow to the second wiring member 160 than the first wiring member 150. Accordingly, the amount of reverse conducting current flowing to the first wiring member 150 is reduced, which reduces the amount of reverse conducting current flowing to the parasitic diode of the semiconductor chip 130, thereby inhibiting the growth of stacking faults within the semiconductor chip 130. This results in mitigating both an increase in the ON resistance of the semiconductor chip 130 and a degradation in reliability of the semiconductor chip 130 and the semiconductor device 100.

Embodiment 2

Figure 4:
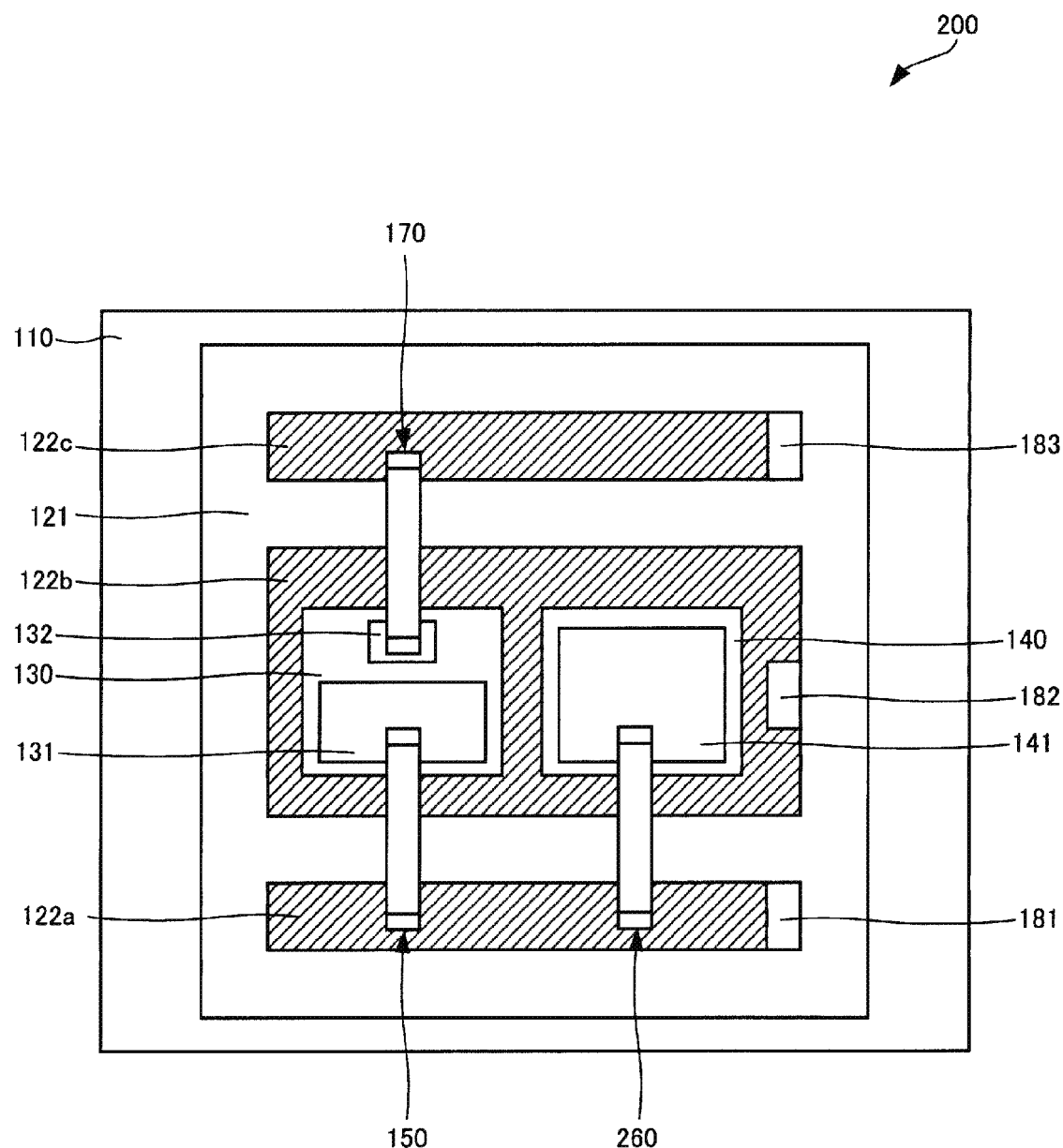
FIG. 4 is a top view of a semiconductor device of Embodiment 2.

In Embodiment 2, FIG. 4 (and FIG. 3) will be used to explain a method that differs from Embodiment 1 in that the reverse conducting current occurring in the semiconductor device is caused to mostly flow towards the diode rather than towards the semiconductor chip.

FIG. 4 is a top view of a semiconductor device according to Embodiment 2.

The semiconductor device 200 of Embodiment 2 has the same configuration as the semiconductor device 100 of Embodiment 1 except for a fourth wiring member 260, and thus the same reference characters are used. The circuit configuration of the semiconductor device 200 is also similar to FIG. 3.

The fourth wiring member 260 is a material with a lower electrical resistivity than the electrical resistivity of the first wiring member 150. If the first wiring member 150 is made of aluminum, for example, then the fourth wiring member 260 is made of copper, which has a lower electrical resistivity than aluminum.

In other words, the fourth wiring member 260 has a lower resistance than the first wiring member 150, and thus the reverse conducting current that flows from the first external terminal 181 towards the second external terminal 182 flows more towards the fourth wiring member 260 than the first wiring member 150. Accordingly, the reverse conducting current flowing to the first wiring member 150 is reduced, and thus the reverse conducting current flowing to the diode D2 of the semiconductor chip 130 is also reduced, which inhibits growth of stacking faults within the semiconductor chip 130. This results in mitigating an increase in the ON resistance of the MOSFET (Q) and the degradation in reliability of the semiconductor device 200.

In the descriptions of Embodiments 1 and 2 above, a MOSFET was used as an example, but an IGBT may be used instead of a MOSFET. In such a case, the "source electrode" in the explanations above corresponds to the "emitter electrode," and the "drain electrode" corresponds to the "collector electrode."

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention

What is claimed is:

1. A semiconductor device, comprising:
   a first conductive plate;
   a second conductive plate disposed side-by-side with and not overlapping with the first conductive plate in a plan view, as seen from a direction perpendicular to a surface of the second conductive plate;
   a semiconductor chip disposed on the second conductive plate and having a source electrode on a front surface of the semiconductor chip;
   a diode disposed on the second conductive plate and having an anode electrode on a front surface of the diode;
   a first wiring member electrically connecting the source electrode to the first conductive plate, the first conductive plate receiving output signals from the source electrode;
   a second wiring member electrically connecting the anode electrode to the first conductive plate;
   a multilayer substrate including an insulating plate having the first conductive plate and the second conductive plate formed directly on a front surface thereof, a rear surface of the insulating plate having a rear conductive plate formed thereon; and
   a heat dissipating base in contact with the rear conductive plate of the multilayer substrate so as to mount the multilayered substrate directly thereon,
   wherein a surface area of the second wiring member is greater than a surface area of the first wiring member in the plan view,
   wherein the insulating plate has a third conductive plate disposed on the front surface thereof, the third conductive plate being arranged side-by-side with the second conductive plate in the plan view,
   wherein the semiconductor chip has a gate electrode on the front surface of the semiconductor chip, and
   wherein the semiconductor device further comprises a third wiring member electrically connecting the gate electrode of the semiconductor chip to the third conductive plate.

2. The semiconductor device according to claim 1, wherein the semiconductor chip and the diode are made of a wide bandgap semiconductor.

3. The semiconductor device according to claim 2, wherein the wide bandgap semiconductor is silicon carbide or gallium nitride.

4. The semiconductor device according to claim 1, wherein the second wiring member is made of at least one of gold, silver, copper, aluminum, and iron.

5. A semiconductor device, comprising:
   a first conductive plate;
   a second conductive plate disposed side-by-side with and not overlapping with the first conductive plate in a plan view, as seen from a direction perpendicular to a surface of the second conductive plate;
   a semiconductor chip disposed on the second conductive plate and having a source electrode on a front surface of the semiconductor chip;
   a diode disposed on the second conductive plate and having an anode electrode on a front surface of the diode;
   a first wiring member electrically connecting the source electrode to the first conductive plate, the first conductive plate receiving output signals from the source electrode;
   a second wiring member electrically connecting the anode electrode to the first conductive plate;
   a multilayer substrate including an insulating plate having the first conductive plate and the second conductive plate formed directly on a front surface thereof, a rear surface of the insulating plate having a rear conductive plate formed thereon; and
   a heat dissipating base in contact with the rear conductive plate of the multilayer substrate so as to mount the multilayered substrate directly thereon,
   wherein an electrical resistance of the second wiring member is smaller than an electrical resistance of the first wiring member,
   wherein the insulating plate has a third conductive plate disposed on the front surface thereof, the third conductive plate being arranged side-by-side with the second conductive plate in the plan view,
   wherein the semiconductor chip has a gate electrode on the front surface of the semiconductor chip, and
   wherein the semiconductor device further comprises a third wiring member electrically connecting the gate electrode of the semiconductor chip to the third conductive plate.

6. The semiconductor device according to claim 5, wherein the semiconductor chip and the diode are made of a wide bandgap semiconductor.

7. The semiconductor device according to claim 6, wherein the wide bandgap semiconductor is silicon carbide or gallium nitride.

8. The semiconductor device according to claim 5, wherein the second wiring member is made of at least one of gold, silver, copper, aluminum, and iron.

* * * * *